(12) United States Patent
Ruster et al.

(10) Patent No.: US 11,313,930 B1
(45) Date of Patent: Apr. 26, 2022

(54) ALTERNATION PULSED DOUBLE RESONANCE DETECTION SCHEME FOR GAPLESS DETECTION IN ATOMIC VAPOR QUANTUM SENSORS

(71) Applicant: Rohde & Schwarz GmbH & Co. KG, Munich (DE)

(72) Inventors: Thomas Ruster, Munich (DE); Melvyn Ho, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/097,771

(22) Filed: Nov. 13, 2020

(51) Int. Cl.
*G01R 33/46* (2006.01)
*G01R 33/26* (2006.01)

(52) U.S. Cl.
CPC ......... *G01R 33/4625* (2013.01); *G01R 33/26* (2013.01)

(58) Field of Classification Search
CPC ........................... G01R 33/4625; G01R 33/26
See application file for complete search history.

(56) References Cited

U.S. PATENT DOCUMENTS

| | | | |
|---|---|---|---|
| 2008/0309350 A1 | 12/2008 | Albert et al. | |
| 2014/0257758 A1 | 9/2014 | Brooks et al. | |
| 2014/0374569 A1 | 12/2014 | Fuhr | |
| 2015/0014535 A1 | 1/2015 | Bushmaker et al. | |
| 2015/0130474 A1 | 5/2015 | Nakamura et al. | |
| 2016/0011055 A1 | 1/2016 | Kawasaki | |
| 2018/0128869 A1 | 5/2018 | Nonaka | |
| 2018/0180475 A1* | 6/2018 | Pearl, Jr. | G01J 3/30 |
| 2019/0128934 A1 | 5/2019 | Ahn et al. | |

FOREIGN PATENT DOCUMENTS

| | | |
|---|---|---|
| CN | 103529296 A | 1/2014 |
| CN | 104808057 A | 7/2015 |
| CN | 106918742 A | 7/2017 |
| CN | 107588873 A | 1/2018 |
| CN | 108414845 A | 8/2018 |
| CN | 108445289 A | 8/2018 |
| CN | 108918967 A | 11/2018 |
| CN | 109164300 A | 1/2019 |
| CN | 109270346 A | 1/2019 |
| CN | 109298239 A | 2/2019 |
| CN | 110187177 A | 8/2019 |
| CN | 110221091 A | 9/2019 |

(Continued)

*Primary Examiner* — Susan S Lee
(74) *Attorney, Agent, or Firm* — Potomac Technology Law, LLC

(57) ABSTRACT

A system for measuring electromagnetic radiation, including at least one light source; a quantum converter arranged to be exposed to radiation emitted by the at least one light source and the electromagnetic radiation, and at least one detector for detecting optical radiation received from the quantum converter. The quantum converter includes at least a first interaction zone and a second interaction zone, and the system establishes at least a first light beam path for exposing the first interaction zone and a second light beam path for exposing the second interaction zone with radiation emitted by the at least one light source. Each laser beam path is controllable to be in an activated state enabling exposure and in a deactivated state preventing exposure of the respective interaction zone.

17 Claims, 3 Drawing Sheets

(56) References Cited

FOREIGN PATENT DOCUMENTS

| | | | |
|---|---|---|---|
| CN | 110702988 | A | 1/2020 |
| CN | 110736876 | A | 1/2020 |
| CN | 111308201 | A | 6/2020 |
| CN | 111426876 | A | 7/2020 |
| EP | 1421353 | A2 | 5/2004 |
| EP | 1468297 | A2 | 10/2004 |
| EP | 2948781 | A1 | 7/2014 |
| EP | 2846164 | A1 | 3/2015 |
| EP | 2948780 | A1 | 12/2015 |
| EP | 2948782 | A1 | 12/2015 |
| EP | 3213093 | A1 | 9/2017 |
| EP | 3245524 | A1 | 11/2017 |
| EP | 3500865 | A1 | 6/2019 |
| EP | 3523662 | A1 | 8/2019 |
| JP | 2015087233 | A | 5/2015 |
| KR | 20120000226 | A | 1/2012 |
| KR | 1 02038136 | B1 | 10/2019 |
| RU | 2214608 | C2 | 10/2003 |
| RU | 119123 | U1 | 8/2012 |
| RU | 2566431 | C1 | 10/2015 |
| WO | WO2012049680 | A1 | 4/2012 |
| WO | WO2015075100 | A1 | 5/2015 |
| WO | WO2017062735 | A1 | 4/2017 |
| WO | WO2018206006 | A1 | 11/2018 |

\* cited by examiner

ALTERNATION PULSED DOUBLE RESONANCE DETECTION SCHEME FOR GAPLESS DETECTION IN ATOMIC VAPOR QUANTUM SENSORS

TECHNICAL FIELD

The present disclosure relates to a system and method for measuring electromagnetic radiation using quantum converters having at least two quantum states and interacting with incident electromagnetic radiation.

BACKGROUND

In nearly every technical field, signal processing becomes increasingly important. The rapid development of processors improves processing performance and allows to include systems using signal processing in many devices of our daily life but also in the industry. The improved performance in many cases even enables real-time signal processing. On the other hand, such a development also increases the need for measurement systems allowing to ensure that certain requirements regarding signal quality are fulfilled. As a direct consequence, the standards for measuring field quantities have continuously increased. In order to comply with increasing requirements, particularly regarding response times and bandwidth, new systems for analyzing RF signals have been developed. Rather new developments are quantum sensors using a diamond, which is exposed to radiation corresponding to an RF signal that is to be analyzed. The measurement system exploits that the diamond responds to the incoming RF radiation by changing its physical properties. This change in physical properties is measured and allows to conclude on the characteristics of the incoming RF radiation. Such a system is described in EP3213093A1.

Another approach is described in WO2018/069324A1, which uses a layer of elementary nanostructures in a magnetically ordered material, which is subjected to the radiofrequency to be measured. The elementary nanostructures have resonance frequencies so that the resonance of the elementary nanostructures can be analyzed by polarization. The resulting image contains information about the spectral output of the RF signal to be analyzed.

Recent scientific publications describe quantum sensors with a laser to excite atoms in a quantum converter before the intended interaction between the RF radiation and the excited atoms takes place. Using a first laser beam, which is the so-called pump beam, the atoms, for example Rubidium atoms, are excited to a certain energy level before a further excitation on hyperfine energy levels caused by the incoming RF radiation is performed. After exciting the atoms by the RF radiation to be measured, a probe beam passes the quantum converter and the absorption of the probe beam is measured to detect Rabi oscillations caused by the microwave excitation. For real-time measurements, such systems have the disadvantage that there is a "blind interval". The cameras that are used for determining the laser absorption of the probe beam may only be used while the probe beam is on. Other known solutions concentrate on continuous laser illumination in combination with using a camera having a short dead time. In fact, such systems cannot provide gapless measurement although the cameras are optimized to reduce the gap, which currently lies in the nanosecond area at best. However, although still not providing gapless detection, cameras with such a reduced gap interval are very expensive. Further, the sensitivity of such continuous measurement systems is strongly reduced compared to the pulse double resonance scheme, and, thus, both known techniques have significant drawbacks.

Accordingly, there is a need for a system and method for improved measurement of electromagnetic radiation using quantum converters to enable measuring electromagnetic radiation such as RF radiation or microwave radiation with a good sensitivity and dynamic range and also enabling gapless measurements.

SUMMARY

Embodiments of the present invention advantageously address the foregoing requirements and needs, as well as others, by providing a system and method for improved measurement of electromagnetic radiation using quantum converters to enable measuring electromagnetic radiation such as RF radiation or microwave radiation with a good sensitivity and dynamic range and also enabling gapless measurements.

According to a first aspect, the system for measuring electromagnetic radiation comprises at least one light source, preferably a laser source, and a quantum converter that can be exposed to radiation emitted by the at least one light source. The system further enables exposing the quantum converter to electromagnetic radiation that may be generated corresponding to an RF or microwave signal to be measured. In that case, an electromagnetic radiation emitter is supplied with a signal to be measured and generates electromagnetic radiation, correspondingly. In the quantum converter the electromagnetic radiation interacts with atoms excited in the quantum converter by the at least one light source. A quantum converter in the sense of the present disclosure comprises a quantum system consisting of at least two quantum states that interact with resonant RF and/or microwave fields. And it is possible to excite at least one of these quantum states to at least one "excited" state by light radiation (followed by a spontaneous or stimulated de-excitation to one of the initial states). During the excitation and de-excitation processes, the quantum converter absorbs and/or emits light, from which the effect of the microwave can be reconstructed. The system further comprises at least one detector for detecting optical radiation received from the quantum converter. The detected optical radiation, which is received from the quantum converter, allows to conclude on the characteristics of the electromagnetic radiation to which the quantum converter and thus the excited atoms had been exposed.

According to the first aspect, the quantum converter comprises at least a first interaction zone and a second interaction zone. The system further comprises a first light beam path and a second light beam path. The first light beam path is established for exposing the first interaction zone, and the second light beam path is established for exposing the second interaction zone. The first interaction zone and the second interaction zone are thus exposed to radiation emitted from the at least one light source via the first light beam path or the second light beam path, respectively. The light beam paths are controllable to allow to activate and deactivate exposure of the respective interaction zones with a light beam. Thus, with the described system it is possible to expose the first interaction zone via the first light beam path with radiation emitted by the at least one light source when the first light beam path is controlled to be in its activated state. On the other hand, exposure of the first interaction zone can be prevented when the first light beam path is controlled to change from its activated state into its deactivated state. In the deactivated state, no exposure of the first interaction zone with a light beam is performed. In the same way, the second light beam path is controllable to change between an activated state and a deactivated state. Similar to the first light beam path this enables to switch the exposure of the second interaction zone with the light beam on and off.

It is to be noted that the explanations presented in the current disclosure all refer to a first interaction zone, a second interaction zone, a first light beam path and a second light beam path. However, this is not limiting. The system could also comprise more than two light beam paths and more than two interaction zones. The number of interaction zones corresponds to the number of light beam paths. Thus, each light beam path has at least one corresponding interaction zone.

Having a plurality of light beam paths and dedicated interaction zones allows to use pulsed double resonance detection as generally known in the art separately for each light beam path. Thus, the time intervals of such a pulsed detection scheme, in which the individual quantum converter's interaction zones are exposed to the electromagnetic radiation to be measured can be offset to each other which allows to gain information on the incidents electromagnetic radiation even at a point in time where common measurement systems might have a blind spot. Further, the detector, or a plurality of detectors in case that for each light beam path and its dedicated interaction zone a separate detector is used, can be cheap because there is no need for a camera having a minimize gap time as detector.

Preferably, the system comprises a source for an electric field or a source for the magnetic field, or both. The quantum converter with all its interaction zones is arranged in the generated field(s). Arranging the quantum converter in the electric field, magnetic field or electric and magnetic field allows to change the energy of the atomic states and, thus, the resonance frequencies for the incident electromagnetic radiation and also the transitions induced by the incident light. The field that is generated and in which the quantum converter is arranged is static in time but might vary with location. In order to enable an easy evaluation of the detection results from a plurality of interaction zones, it is desirable that the variation and the strength of the field is identical for each interaction zone.

Preferably, the system comprises a controller that controls each light beam path to change between its activated state and deactivated state. The controller may be a microprocessor generating control signals for activating and deactivating the light beam paths. It is to be noted that the individual light beam paths may be established using a single light beam source, splitting up the light beam output and then individually switching the split light beams. The switches may be realized by using electro-optical modulators and polarizing beam splitters, or acoustical-optical modulators and spatially separating the zero-order and first-order beams. It is to be noted that "switching" a light beam is understood to include any measure that allows to bring the light beam path from its activated state to its inactivated state and vice versa. Thus, it is also possible to shift the light beam in position, for example via an acousto-optical deflector, or to partially block a large light beam.

It is specifically preferred that the controller controls the light beam paths to be brought into their respective activated state and deactivated state alternately. Such alternately change of the states allows a pulsed detection scheme for each of the light beam paths and their dedicated interaction zones. Such a pulsed scheme, which will be explained later in greater detail, uses the laser to excite the atoms in the quantum converter in the activated state and allows to expose in the deactivated state the quantum converter to the electromagnetic radiation, which may be generated corresponding to an RF signal to be measured. Having temporal offset between the pulsed schemes of the first light beam path and the second light beam path allows to perform a measurement in the one path while at the same time the other path has a blind spot.

Preferably, the detection results from all involved paths are finally combined to give one gapless measurement of the electromagnetic radiation. This is achieved by ensuring that for each point in time one of the light beam paths is in its deactivated state such that exposure with the electromagnetic radiation is possible. The minimum requirement allowing gapless detection is having a first and a second path with the time intervals for the respective activated states and deactivated states being set such that the deactivated state is at least as long as the activated state of the other path. Coordinating the temporal offset between the scheme of the first path and the scheme of the second path then allows to have at any time at least one path in its deactivated state.

According to an exemplary embodiment, the detector is controlled to individually measure optical radiation received from the interaction zones while the light beam path for the respective interaction zone in its activated state. The information on the electromagnetic radiation in such a case is derived from an absorption measured in the light beam passing through the quantum converter, which previously was exposed to the electromagnetic radiation to be measured. The absorption is measured as a relative reduction of the light beam passed through the quantum converter.

It is particularly preferred that the time interval in which the light beam path is in its activated state comprises a pump phase and the probe phase. Distinguishing between the pump phase and the probe phase allows to reduce the power for the probe phase, which improves the detection of the absorption since the detector does not have to deal with the high-power during the pump phase.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Further aspects and advantages of the invention will become evident for the skilled reader by means of the following detailed description of an embodiment of the invention, when taking into conjunction with the figures of the enclosed drawings.

DETAILED DESCRIPTION

A system and method for improved measurement of electromagnetic radiation using quantum converters to enable measuring electromagnetic radiation such as RF radiation or microwave radiation with a good sensitivity and dynamic range and also enabling gapless measurements, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in computer memory storage.

Figure 1:
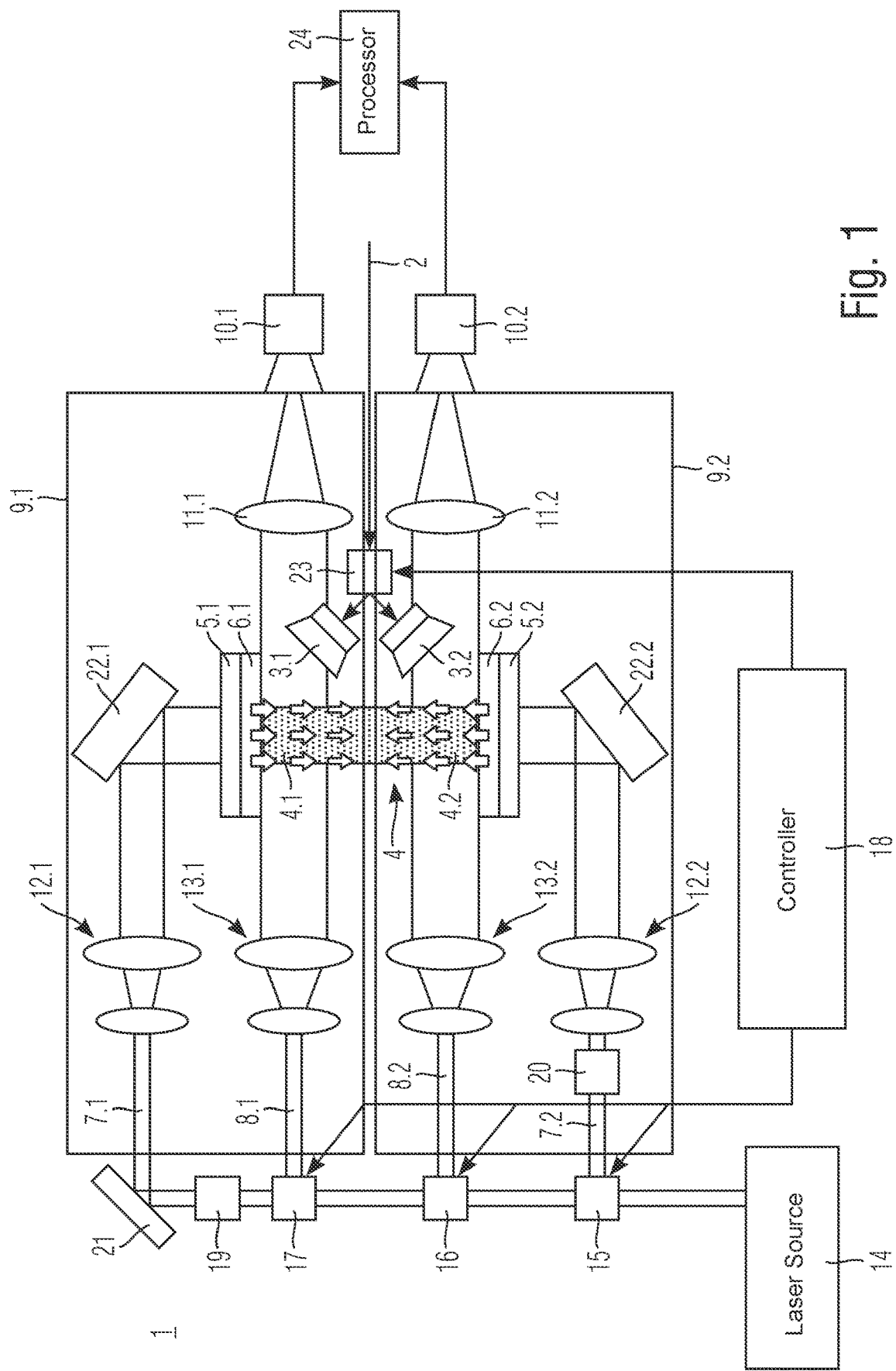
FIG. 1 illustrates a system for measuring electromagnetic radiation according to an embodiment of the present disclosure.

System 1 according to a preferred embodiment of the invention is illustrated in FIG. 1. The system 1 measures electromagnetic radiation generated in response to an electric signal 2 supplied to the system 1. The measurement is performed by generating from the supplied electric signal electromagnetic radiation emitted by a first antenna 3.1. The electromagnetic radiation emitted by the first antenna 3.1 is directed to a first interaction zone 4.1 where it interacts with excited atoms. The electromagnetic radiation emitted by the first antenna 3.1 (and also by the second antenna 3.2 introduced later) is called microwave radiation hereinafter.

The first interaction zone 4.1 comprises, in an enclosure, a gas, which interacts with the microwave radiation to which it is exposed. The gas enclosed in the first interaction zone 4.1 preferably is Rubidium gas. A pair of permanent magnets 5.1, 5.2 as magnetic field source establishes a magnetic field in the first interaction zone 4.1, which is temporally static. The field is homogeneous or it may vary over the volume of the first interaction zone 4.1. The embodiment shown in FIG. 1 further comprises an electric field source indicated by reference numerals 6.1 and 6.2. The electric field is optional and also temporally static with its field strength being homogeneous or varying over the volume of the first interaction zone 4.1. Although the illustrated embodiment shows a combination of a magnetic field and an electric field, preferably only a magnetic field is used.

For measuring the microwave radiation generated based on the electric signal 2 Rabi oscillations are caused by the microwave radiation interacting with the gas in the first interaction zone 4.1. This is achieved by first exciting the gas in the first interaction zone 4.1 using a first pump laser beam 7.1 to which the gas in the first interaction zone 4.1 is exposed. The measurement itself is performed using a first probe laser beam 8.1 passing through the gas in the first interaction zone 4.1. The probe laser beam 8.1 which has passed the gas in the interaction zone 4.1 is detected by a first camera 10.1 as optical radiation received from the first interaction zone 4.1. It is to be noted that in the present disclosure and with reference to the drawings, the light source is assumed to be a laser source. The same is true for the first and second light beam path which, in the present embodiment, are realized by laser beam paths.

The time scheme for exposing the gas in the interaction zone 4.1 with the first pump beam 7.1, the microwave radiation emitted by the first antenna 3.1 and the first probe laser beam 8.1 will be explained below with reference to FIG. 2.

The first pump laser beam 7.1 and the first probe laser beam 8.1 commonly establish the first laser beam path 9.1 configured to expose the first interaction zone 4.1 with laser light that is initially output by the laser source 14. The illustrated embodiment of the system 1 shows that in addition to the first laser beam path 9.1 a second laser beam path 9.2 is provided. The second laser beam path 9.2 comprises all the components as the first laser beam path 9.1, namely a second pump laser beam 7.2 and a second probe laser beam 8.2. When switched to its activated state, the second laser beam path 9.2 exposes a second interaction zone 4.2 in the same way as explained above with reference to the first laser beam path 9.1. For measuring the microwave radiation corresponding to the electric signal 2, a second antenna 3.2 is provided also emitting microwave radiation corresponding to the electric signal 2 to be measured to the second interaction zone 4.2.

According to a preferred embodiment, the first interaction zone 4.1 and the second interaction zone 4.2 are commonly formed by a gas enclosure as a quantum converter 4. Thus, in the preferred embodiment the first interaction zone 4.1 and the second interaction zone 4.2 are volume portions of the same gas enclosure constituting a single quantum converter cell as quantum converter 4. The magnetic field source 5.1, 5.2 and the electric field source 6.1, 6.2 are arranged such that their respective fields are commonly applied to the entire gas enclosure of the quantum converter 4. This arrangement ensures that the temporally static location variation of the respective field strengths is symmetrically as indicated by the dashed line in the quantum converter 4 separating the first interaction zone 4.1 and the second interaction zone 4.2. Such a symmetric arrangement ensures that the detection results from the first laser beam path 9.1 and the second laser beam path 9.2 are directly comparable and can be easily combined for the analysis of the supplied electric signal 2.

While in the preferred embodiment a single quantum converter cell, which comprises the first interaction zone 4.1 and the second interaction zone 4.2 constitutes the quantum converter, it is also possible to use two (or even more) separate quantum converter cells, which are preferably identical, commonly constituting the quantum converter 4 with the first interaction zone 4.1 and the second interaction zone 4.2 established by different quantum converter cells. Further, the present invention may also use a another quantum converter type instead of (a) gas enclosure(s), like for example an NV diamond. Again, either a single NV diamond providing two (or more) interaction zones may be used or two (or more) separate NV diamonds together constituting the quantum converter.

In the preferred embodiment, a single laser source 14 is used for outputting a single laser beam. For establishing the first laser beam path 9.1 and the second laser beam path 9.2, a plurality of beam switches 15, 16 and 17 are arranged in the laser beam output by the laser source 14. The beam switches 15, 16 and 17 are able to change the direction of the incoming laser beam according to respective control signals received from a controller 18 as indicated by the arrows.

For the following explanations, it is assumed that switching a beam switch 15, 16 or 17 "on" means that the incoming laser beam is redirected, and switching the beam switches 15, 16 or 17 "off" means that the incoming laser beam may pass the respective switch straight. Thus, when the first beam switch 15 is switched "on", the laser beam output by the laser source 14 is redirected to become the second pump laser beam 7.2. When the first beam switch 15 is "off" and the second beam switch 16 is "on", the laser beam output by the laser source 14 becomes the second probe beam 8.2. When the first beam switch 15 and the second beam switch 16 are "off" and the third beam switch 17 is "on", the laser beam emitted by the laser source 14 becomes the first probe laser beam 8.1. Finally, when all beam switches 15, 16 and 17 are "off", the laser beam output by the laser source 14 becomes the first pump laser beam 7.1.

It is to be noted that the directions of the laser beams as depicted in the drawing do not show the true three-dimensional arrangement in order to illustrate the principle of the present invention in an easier way. While the first probe laser beam 8.1 and the second probe laser beam 8.2 are in fact parallel and pass through the first interaction zone 4.1 and the second interaction zone 4.2 respectively so that an absorption can be determined from the optical radiation received from the quantum converter 4 and detected by the first camera 10.1 and the second camera 10.2 respectively, the first pump laser beam 7.1 and the second pump laser beam 7.2 in reality expose the quantum converter 4 from the same side of the quantum converter 4, for example from the top. This is achieved by providing a first beam elevator 19 after the third beam switch 17 elevating the laser beam, which passed the third beam switch 17 above the quantum converter 4.

In the same way a second beam elevator 20 is provided elevating the second probe laser beam 8.2 above the quantum converter 4 after the laser beam output by the laser source 14 has been redirected by the first beam switch 15 switched "on".

In order to enter the quantum converter 4 from the top of the quantum converter 4, the elevated first pump laser beam 7.1 is redirected by a mirror 22.1. The second pump laser beam 7.2 is redirected similarly by a further mirror 22.2. In case that the elevation of the first pump laser beam 7.1 lies outside the area of the quantum converter 4, a further redirecting mirror 21 may be provided. The elevators 19 and 20 can be realized by a pair of mirrors.

Generally, the shape of the laser beams may be adapted by using lens systems as indicated by reference numerals 12.1, 12.2, 13.1, and 13.2. In the same way, the first probe laser beam 8.1 and the second probe laser beam 8.2 may be shaped by further lens systems 11.1 and 11.2 as required by the first camera 10.1 and the second camera 10.2.

The controller 18 that generates and outputs the control signals for the beam switches 15, 16 and 17 also generates and outputs a control signal for a microwave switch 23. The microwave switch 23 selectively connects to the first antenna 3.1 and the antenna 3.2 in order to emit the microwave radiation according to the supplied electric signal 2 by either one of the antennas 3.1 or 3.2.

The preferred embodiment of the system 1 shown in the drawing uses a pair of cameras 10.1 and 10.2 as a detector for detecting the first probe laser beam 8.1 and the second probe laser beam 8.2, respectively. However, it is also possible to use a single common detector and a shutter system allowing to selectively detect the first probe laser beam 8.1 or the second probe laser beam 8.2 after passing the respective interaction zone 4.1 or 4.2. In such a case, the shutter would need to be controlled by the controller 18 as well. Further, the lens systems 11.1 and 11.2 would need to direct the laser beams so that a single detector can receive both laser beams.

For an analysis of the detected laser beams of the first camera 10.1 and the second camera 10.2, a processor 24 is provided with the camera outputs for further processing.

As mentioned above each of the laser beam paths 9.1 and 9.2 performs a pulsed double resonance detection as generally known in the art. According to the invention, the time schemes for the two laser beam paths 9.1 and 9.2 are coordinated such that a gapless measurement is possible. The time scheme for the measurement will now be explained with reference to FIG. 2.

Figure 2:
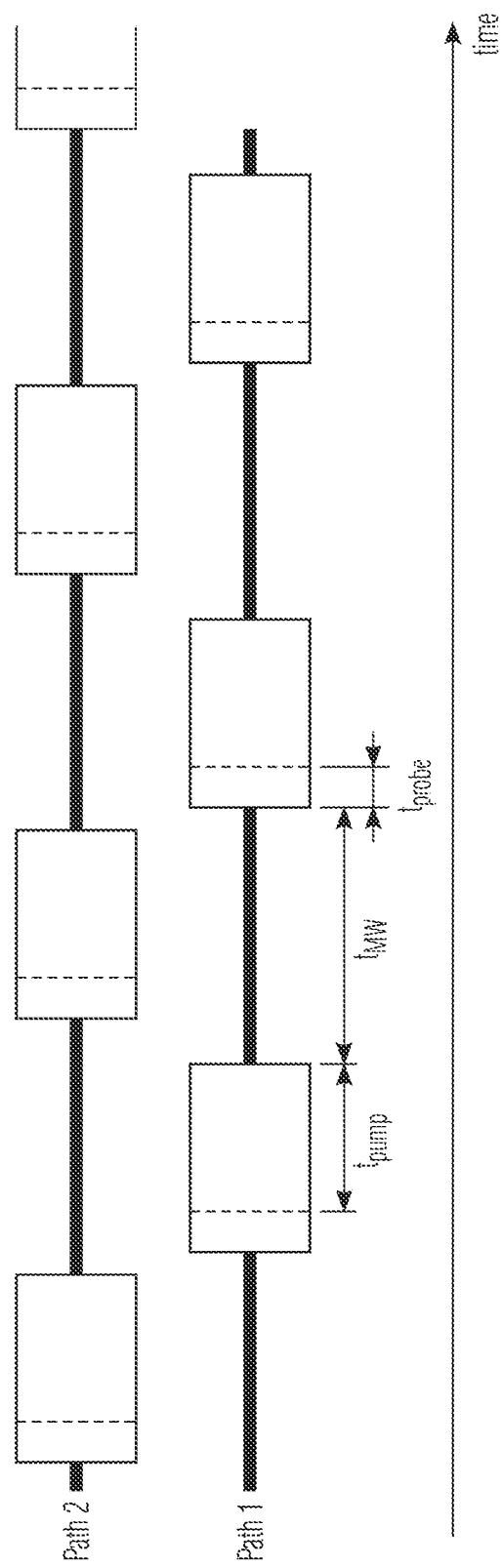
FIG. 2 is an illustration of a time scheme for measuring electromagnetic radiation using the system according to FIG. 1.

FIG. 2 shows the different states of the first laser beam path 9.1 and the second laser beam path 9.2 on a common time axis. According to a preferred embodiment, the time scheme for the first laser beam path 9.1 and for the second laser beam path 9.2 are identical, however temporally offset. As indicated exemplarily for a section of the second laser beam path 9.1, first, the first, second and third beam switches 15, 16 and 17 are switched "off" so that the first interaction zone 4.1 is exposed to the first pump laser beam 7.1 for a time interval tpump, also called pump phase. In the pump phase the laser source 14 is operated to output a laser beam with a first power adapted to excite the atoms in the quantum converter 4. This time interval during which the gas atoms in the first interaction zone 4.1 are excited by the first pump laser beam 7.1 is followed by a time interval tMW during which the first interaction zone 4.1 is not exposed to laser light.

In this time interval tMW, the first interaction zone 4.1 is exposed to the microwave radiation emitted by the first antenna 3.1. After exposing the first interaction zone 4.1 with the microwave radiation, the first probe laser beam 8.1 is switched on by switching the third beam switch 17 "on" for allowing the first camera 10.1 to detect the first probe laser beam 8.1 after having passed the first interaction zone 4.1. The detection is performed in the time interval tprobe also called probe phase during which the laser source 14 emits a laser beam with a second power being adapted to be suitable for detection by the first camera 10.1. The second power is less than the first power. At the end of the probe phase tprobe the process as explained above is repeated by starting with switching on the first laser beam 7.1 again. The probe phase and the pump phase are commonly denoted as activated state of the laser beam path. Similarly, during the time interval in which the first interaction zone 4.1 is exposed to the microwave radiation, the first laser beam path 9.1 is in its deactivated state.

As it can be easily seen in FIG. 2, the time scheme for switching on and off the second pump laser beam 7.2 (first laser beam switch 15 "on") and the second probe laser beam 8.2 (first laser beam switch 15 "off" and second laser beam switch "on") is identical but temporally offset compared to the first laser beam path 9.1. Further, the time interval tMW is longer than the sum of the pump phase tpump and probe phase tprobe. In an ideal case however, the microwave pulse time tMW matches the sum of the pump phase tpump and the probe phase tprobe.

The temporal offset between corresponding states in the laser beam paths is set such that the time interval of the activated state consisting of probe phase tprobe followed by pump phase tpump of one laser beam path 9.1 or 9.2 entirely lies in the time interval tMW of the other laser beam path 9.2 or 9.1, respectively. Such a setting allows gapless measurement of a supplied RF signal 2. Further, in such a case it is possible to use a single laser source 14 together with the beam switches 15, 16 and 17 for establishing both laser beam paths. However, in such a case it is necessary to switch off the laser source 14 for time periods in which tMW of the first laser beam path 9.1 and tMW of the second laser beam path 9.2 overlap. This could be achieved by providing an additional beam switch at the output of the laser beam source 14.

In case that the time interval tMW is shorter than the sum of pump phase tpump and probe phase tprobe, separate laser sources for the first laser beam path 9.1 and the second laser beam path 9.2 may be provided.

Figure 3:
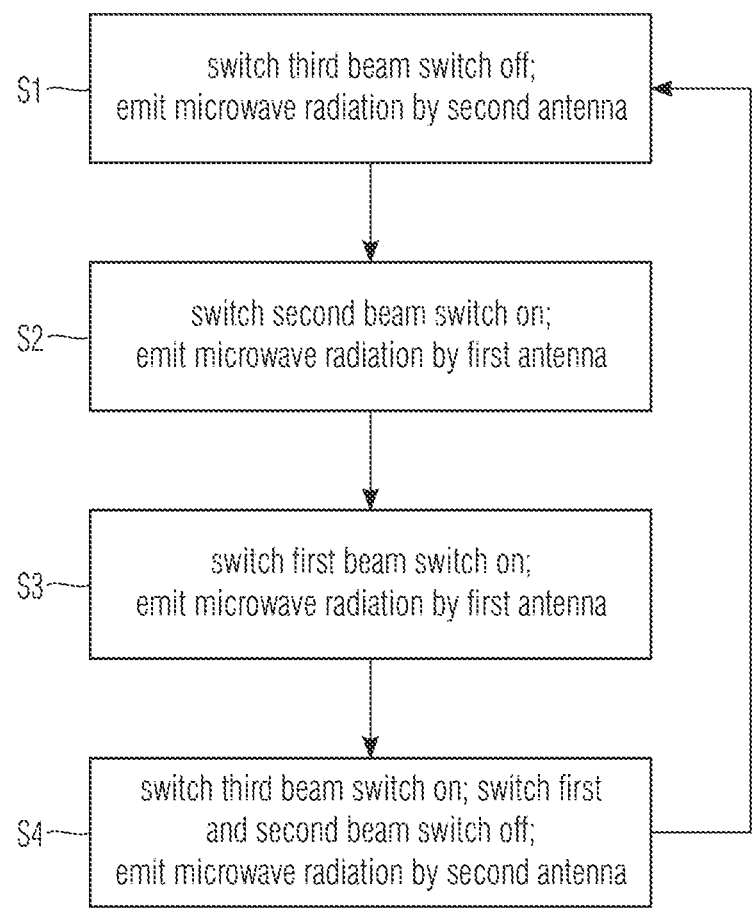
FIG. 3 is a simplified flowchart illustrating the main method steps.

A simplified flowchart of the method explained above in greater detail and using the system 1 as explained with reference to FIG. 1 is presented in FIG. 3 and will be briefly explained hereinafter. First, in step S1, the first laser beam path 9.1 is in its activated state and the output of the laser source 14 is switched on with all beam switches 15, 16 and 17 being "off" thereby exposing the first interaction zone 4.1 with the first pump laser beam 7.1. At that time, the second laser beam path 9.2 is in its deactivated state and the second interaction zone 4.2 is exposed to microwave radiation. In step S2 the second probe beam 7.2 is switched on by switching on the second beam switch 16 thereby bringing the second laser beam path 9.2 in its activated state and the first laser beam path 9.1 in its deactivated state. Simultaneously, the second camera 10.2 starts detecting the radiation received from the second interaction zone 4.2, which is the second probe laser beam passed through the interaction zone 4.2. In the deactivated state of the first laser beam path 9.1, the first interaction zone 4.1 is exposed to microwave radiation emitted from antenna 3.1.

At the end of the probe phase of the second laser beam path 9.2, the first beam switch 15 is switched on in step S3 to expose the second interaction zone 4.2 with the second pump laser beam 7.2. The second laser beam path 9.2 is thus still in its activated state in the first laser beam path 9.1 in its deactivated state. At the end of the pump phase of the second laser beam path 9.2, the first laser beam switch 15 and the second laser beam switch 16 are switched off, thereby switching the second laser beam path 9.2 into its deactivated state. The third laser beam switch 17 is switched on in step S4 thereby switching the first laser beam path 9.1 to its activated state by switching on the first probe laser beam 8.1. Simultaneously, the first camera 10.1 starts to detect the first probe laser beam 8.1 received from the first interaction zone 4.1. It is to be noted that the second laser beam switch 16 could also be switched back to "off" at the end of the probe phase of the second laser beam path 9.2.

At the end of the probe phase of the first laser beam path 9.1, the procedure as described above starts again. The steps S1 to S4 are repeated as long as the measurement is performed.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A system for measuring electromagnetic radiation, comprising
   at least one light source;
   a quantum converter comprising at least two quantum states interacting with incident electromagnetic radiation, the at least one quantum converter being arranged to be exposed to radiation emitted by the at least one light source and the electromagnetic radiation; and
   at least one detector for detecting optical radiation received from the at least one quantum converter; and
   wherein the quantum converter comprises at least a first interaction zone and at least a second interaction zone, and
   wherein the system is configured to establish at least a first light beam path for exposing the first interaction zone and a second light beam path for exposing the second interaction zone with radiation emitted by the at least one light source, each light beam path being controllable to be in an activated state enabling exposure and a deactivated state preventing exposure of the respective interaction zone.

2. The system of claim 1, wherein the system comprises an electromagnetic radiation emitter configured to meet electromagnetic radiation corresponding to a received RF or microwave signal.

3. The system of claim 1, wherein the system comprises at least one of an electric field source and a magnetic field source with the quantum converter being arranged in at least the electric field or the magnetic fields, respectively.

4. The system of claim 1, wherein the system comprises a controller configured to control each light beam path to change between its respective activated state and deactivated state alternately.

5. The system of claim 3, wherein the controlling of the light beam paths is performed such that time intervals in which the light beam paths are in their deactivated states are temporally offset.

6. The system of claim 4, wherein time intervals in which the light beam paths are in their activated state and deactivated state are set such that for each point in time at least one light beam path is in its deactivated state.

7. The system of claim 1, wherein the detector is controlled to individually measure radiation received from the interaction zones while the light beam path for the respective interaction zone is in its activated state.

8. The system of claim 1, wherein each time interval in which a light beam path is in its activated state comprises a pump phase and a probe phase.

9. The system of claim 8, wherein the detector is controlled to individually measure radiation received from the interaction zones while the light beam path for respective interaction zone is in its probe phase.

10. A method for measuring electromagnetic radiation comprising the following steps:
providing at least one light source;
arranging a quantum converter such that it is exposed to radiation emitted by the at least one light source;
providing electromagnetic radiation for exposing the quantum converter to the electromagnetic radiation;
detecting by at least one detector optical radiation received from the quantum converter;
establishing at least a first light beam path for exposing a first interaction zone of the quantum converter and establishing a second light beam path for exposing a second interaction zone of the quantum converter with radiation emitted by at least one light source via at least the respective first light beam path or second light beam path and
separately controlling the first light beam path and the second light beam path to change between an activated state and a deactivated state, wherein exposure of an interaction zone with radiation emitted from the at least one light source via its dedicated light beam path is enabled in the activated state and is prevented in the deactivated state of the light beam path.

11. The method according to claim 10, wherein each light beam path is controlled to change between its activated state and deactivated state alternately.

12. The method according to claim 10, wherein the lights beam paths are controlled such that the deactivated states are temporally offset.

13. The method according to claim 12, wherein time intervals in which the light beam paths are in their activated state and deactivated state are set such that for each point in time at least one light beam path is in its deactivated state.

14. The method according to claim 10, wherein an electromagnetic radiation emitter is controlled to emit electromagnetic radiation corresponding to a received RF signal to be measured selectively such that interaction zones for which the corresponding light beam path is in its deactivated state is exposed to the electromagnetic radiation.

15. The method according to claim 10, wherein the detector is controlled to individually measure optical radiation received from the interaction zones while the light beam path for the respective interaction zone is in its activated state.

16. The method according to claim 10, wherein each time interval in which one of the first and second light beam paths is in its activated state comprises a pump phase and a probe phase.

17. The method according to claim 16, wherein the detector is controlled to individually measure optical radiation received from the interaction zones while the light beam path for the respective interaction zone is in its probe phase.

* * * * *